United States Patent
Luo et al.

(10) Patent No.: US 7,105,440 B2
(45) Date of Patent: Sep. 12, 2006

(54) SELF-FORMING METAL SILICIDE GATE FOR CMOS DEVICES

(75) Inventors: Zhijiong Luo, Carmel, NY (US); Sunfei Fang, LaGrangeville, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/905,629

(22) Filed: Jan. 13, 2005

(65) Prior Publication Data

US 2006/0154413 A1 Jul. 13, 2006

(51) Int. Cl.
*H01L 21/44* (2006.01)
(52) U.S. Cl. .................. 438/664; 438/197; 438/663
(58) Field of Classification Search ................ 438/197, 438/664, 663
See application file for complete search history.

(56) References Cited

U.S. PATENT DOCUMENTS

| | | | |
|---|---|---|---|
| 6,555,453 B1 | 4/2003 | Xiang et al. | |
| 6,562,718 B1 | 5/2003 | Xiang et al. | |
| 2003/0207565 A1* | 11/2003 | Tan et al. | 438/664 |
| 2005/0064690 A1* | 3/2005 | Amos et al. | 438/592 |

\* cited by examiner

*Primary Examiner*—Thao P. Le
(74) *Attorney, Agent, or Firm*—H. Daniel Schnurmann

(57) ABSTRACT

A process for forming a metal suicide gate in an FET device, where the suicide is self-forming (that is, formed without the need for a separate metal/silicon reaction step), and no CMP or etchback of the silicon material is required. A first layer of silicon material (polysilicon or amorphous silicon) is formed overlying the gate dielectric; a layer of metal is then formed on the first layer, and a second layer of silicon on the metal layer. A high-temperature (>700° C.) processing step, such as source/drain activation anneal, is subsequently performed; this step is effective to form a silicide layer above the gate dielectric by reaction of the metal with silicon in the first layer. A second high-temperature processing step (such as source/drain silicidation) may be performed which is effective to form a second silicide layer from silicon in the second layer. The thicknesses of the layers are such that in the high-temperature processing, substantially all of the first layer and at least a portion of the second layer are replaced by silicide material. Accordingly, a fully silicided gate structure may be produced.

19 Claims, 7 Drawing Sheets

SELF-FORMING METAL SILICIDE GATE FOR CMOS DEVICES

FIELD OF THE INVENTION

This invention relates to semiconductor device manufacturing, and in particular the manufacture of complementary metal-oxide-semiconductor (CMOS) FET devices. More particularly, the invention relates to formation of silicided metal gates in these devices.

BACKGROUND OF THE INVENTION

The ongoing reduction in size of electronic device elements poses problems in device performance which must be addressed using new materials and fabrication techniques. These problems are especially acute in the case of gate structures for high-performance CMOS devices. A typical CMOS gate structure is shown schematically in FIG. 1. Gate structure 100 (often called a gate stack) is fabricated on the surface of substrate 1, which typically is a semiconductor wafer (e.g. Si, Ge, SiGe, as well as semiconductors over a buried insulator). Source and drain regions 22, 23 are formed near the surface of the wafer. Gate structure 100 includes conducting element 110 (typically polysilicon; p+ doped and n+ doped in PFETs and NFETs respectively) overlying dielectric layer 111. In present-day devices the equivalent oxide thickness of the gate dielectric has been reduced to less than 2 nm. At the same time, linewidths have been reduced so that the lateral extent of gate structure 100 is now in the sub-65 nm range.

With present-day gate dielectric thicknesses, it is desirable to minimize the polysilicon depletion effect, which occurs when the gate is turned on and a region devoid of charge forms at the polysilicon/dielectric interface (interface 112a in FIG. 1). The appearance of this depletion region reduces the capacitance of the gate and thus increases the electrical thickness, so that device performance is reduced. If the polysilicon depletion region could be eliminated, the electrical dielectric thickness would be reduced with no substantial increase in the leakage current. This would permit improved device performance without a further reduction in the thickness of the gate dielectric 112.

It therefore is desirable to eliminate the polysilicon from the gate structure (or at least remove the polysilicon from contact with the gate dielectric), as several benefits may be obtained. The elimination of the polysilicon depletion effect would decrease the effective electrical thickness of the gate dielectric. Interactions between the polysilicon and gate dielectric materials would be avoided, which in turn would avoid the problem of boron penetration. This would lead to faster devices which consume less power. Replacing the polysilicon with other materials also may enable new designs for gate stacks which are compatible with high-k gate dielectrics.

Recently there has been substantial interest in replacing polysilicon gate conductors with metal silicide gate electrodes. In general, forming a silicided gate involves reacting a layer of metal with an underlying layer of silicon (polysilicon or amorphous silicon), which in turn is in contact with the gate dielectric. A substantial number of additional process steps are required as compared to fabrication of a conventional polysilicon gate. Furthermore, a typical silicide gate fabrication scheme requires chemical-mechanical polishing (CMP) or etching back of the polysilicon layer. These processes often fail to provide adequate uniformity (across the wafer) in the polysilicon thickness. This in turn results in low-quality silicided gates and low device yields.

Accordingly, there is a need for a metal silicide gate fabrication process which minimizes the number of additional steps, and avoids the uniformity problems associated with conventional fabrication techniques.

SUMMARY OF THE INVENTION

The present invention addresses the above-described need by providing a process in which the metal suicide gate is self-forming (that is, formed without the need for a separate metal/silicon reaction step), no CMP or etchback of the polysilicon is required, and in which only one additional step is used in comparison to the conventional polysilicon gate process. According to a first aspect of the invention, this is done by forming a first layer of a silicon material (which may be polysilicon or amorphous silicon) overlying the gate dielectric, forming a layer of metal on the first layer, and then forming a second layer of silicon material on the metal layer. At least one high-temperature (>700° C.) processing step is performed subsequent to forming those layers; this processing step is effective to form a first silicide layer above the gate dielectric by reaction of the metal with silicon in the first layer. The thicknesses of the layers are such that in the first high-temperature processing step, at least a portion of the first layer and at least a portion of the second layer are reacted with the metal to form the silicide material. A second high-temperature processing step may be performed which is effective to form a second silicide layer from silicon in the second layer; the second silicide layer overlies the first silicide layer and in contact therewith. As a result of the high-temperature processes, substantially all of the silicon in the first layer is replaced by the silicide material.

In one embodiment of the invention, the first high-temperature processing step is an annealing step for source and drain portions of the FET device; alternatively, this step could be any of the other high temperature annealing steps performed in subsequent processing. The second high-temperature processing step is a silicidation process for source and drain portions of the FET device. The metal may be one of W, Ti, Pt, Ta, Nb, Hf and Mo. Substantially all of the silicon is reacted to form a silicide material, so that a fully silicided gate is produced.

In another embodiment of the invention, a second high-temperature processing step, performed subsequent to the first high-temperature processing step, is effective to form a second silicide layer from silicon material in the second layer; this second silicide layer overlies a remaining portion of silicon in the second layer.

According to a second aspect of the invention, a gate structure for an FET device is provided which includes a gate dielectric on a substrate, a first layer of a first silicide overlying the gate dielectric and in contact therewith, and a second layer of a second silicide overlying the first silicide layer. The second layer is of the same material as silicide in source and drain regions of the FET. The gate structure may be fully silicided (that is, the material overlying the gate dielectric may consist essentially of silicide in the first and second layers). Alternatively, the gate structure may include a third layer of silicon between the first and second silicide layers.

DETAILED DESCRIPTION OF PREFERRED EMBODIMENTS OF THE INVENTION

Figure 1:
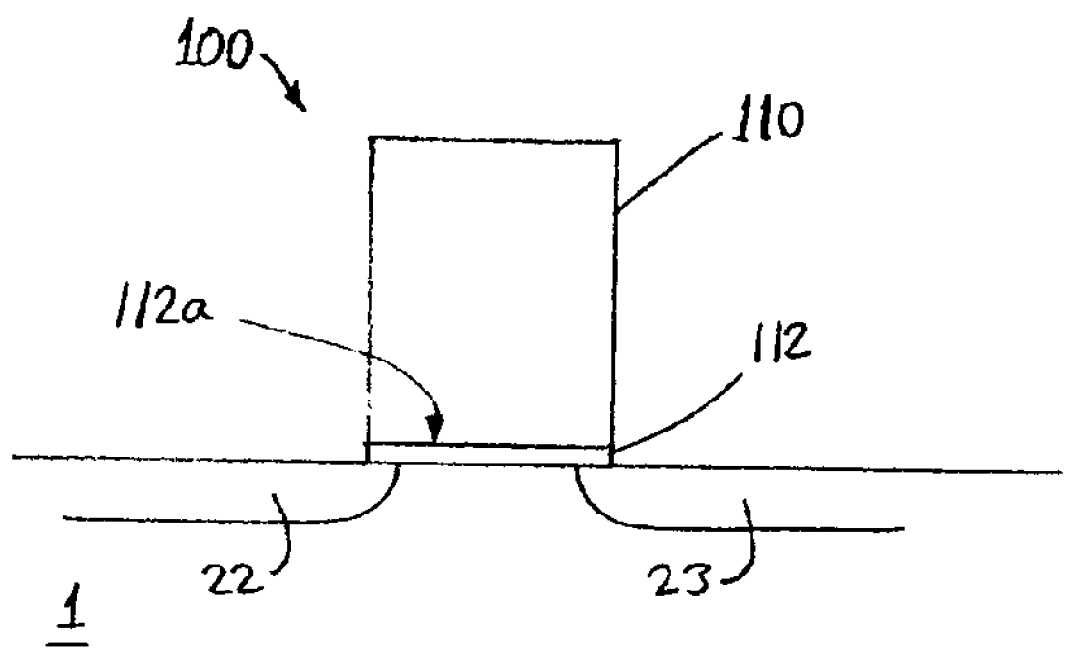
FIG. 1 schematically illustrates a conventional CMOS structure including a polysilicon gate conductor.
Figure 2:
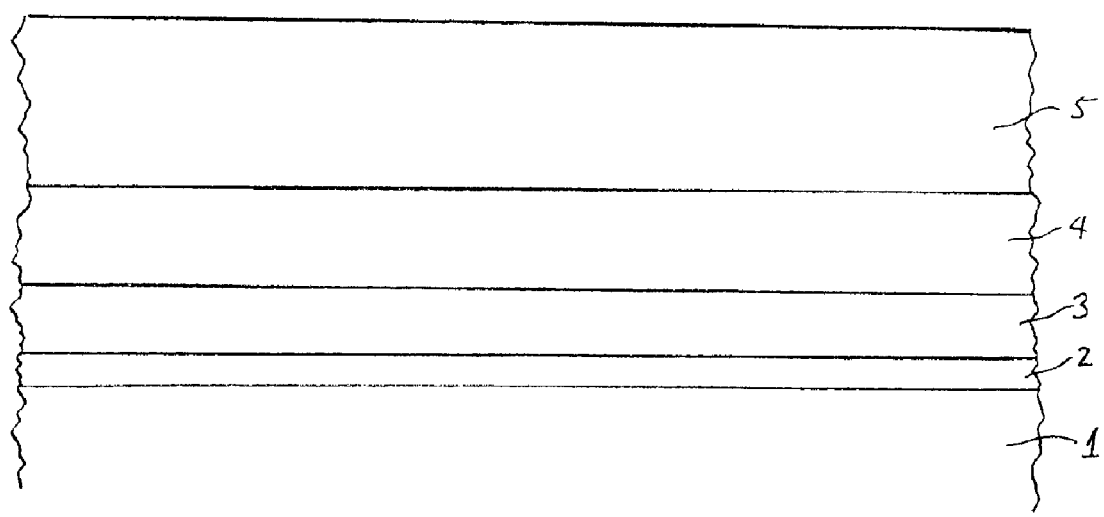
FIG. 2 illustrates the deposition of dielectric, silicon and metal layers on a substrate, in accordance with an embodiment of the invention.

In the following descriptions, it is assumed that conventional CMOS fabrication techniques are employed up to the beginning of formation of the gate structure. FIG. 2 illustrates the sequence of deposition steps used to form the gate. The gate dielectric layer 2 is first formed on the substrate 1. Substrate 1 may be a wafer of bulk semiconductor (Si, Ge, SiGe, etc.) or semiconductor material on an insulator (oxide, nitride, oxynitride, etc.). Gate dielectric 2 may be oxide, oxynitride, a high-k material, $HfO_2$, etc. A thin layer 3 of silicon material is deposited on the gate dielectric, and a layer of metal 4 is then deposited thereon. In this embodiment, the silicon material is polysilicon; the material may also be amorphous silicon. Metal layer 4 is chosen to be a metal having a thermally stable silicide, with the silicide being formed by a reaction at a high temperature ($>700°$ C.); metals meeting this requirement include W, Ti, Pt, Ta, Nb, Hf and Mo. The thicknesses of layers 3 and 4 are chosen to ensure that the silicon material in layer 3 will be fully silicided during a high-temperature process which is performed later. In addition, the silicon in layer 3 may be doped before the deposition of metal layer 4, so that the subsequently formed silicide will have a work function appropriate for the type of device being fabricated (e.g. PFET or NFET).

Another layer 5 of silicon material (polysilicon in this embodiment; alternatively amorphous silicon) is deposited on top of metal layer 4. It will be appreciated that in this embodiment of the invention, one extra deposition step is performed in comparison to the conventional gate fabrication process; that is, the silicon layer is deposited as two layers instead of a single layer.

Figure 3:
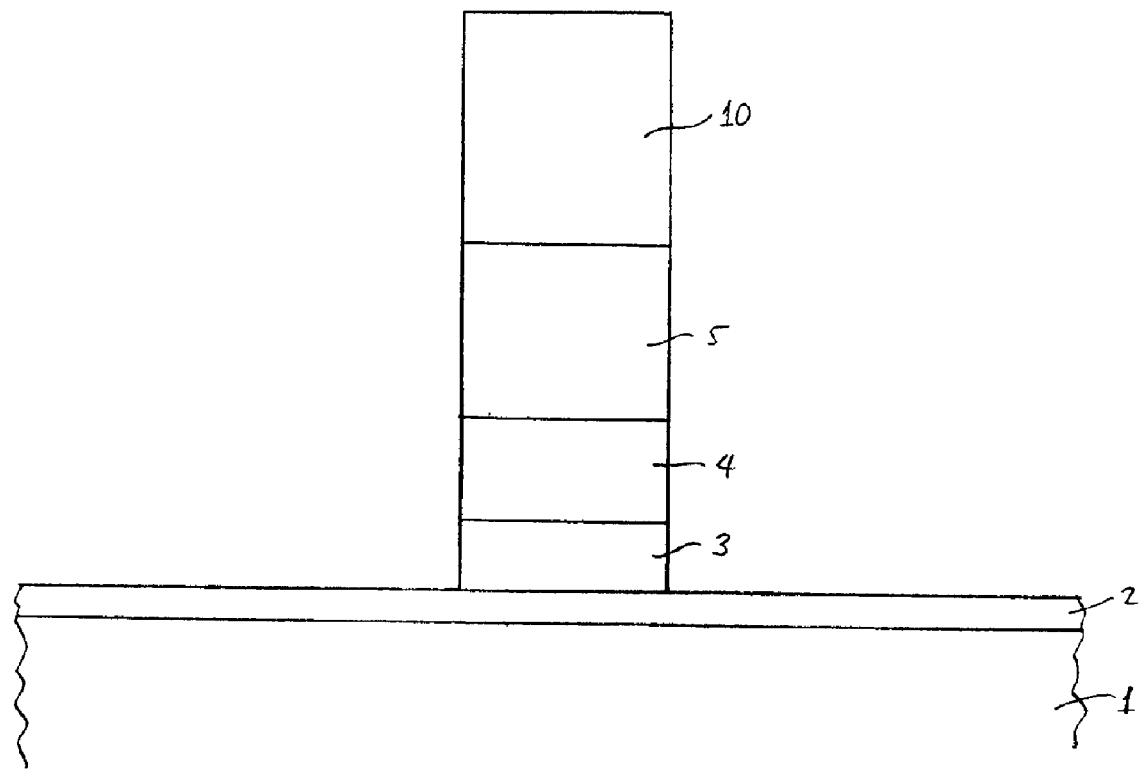
FIG. 3 illustrates a gate structure according to an embodiment of the invention, before formation of the source and drain regions.
Figure 4A:
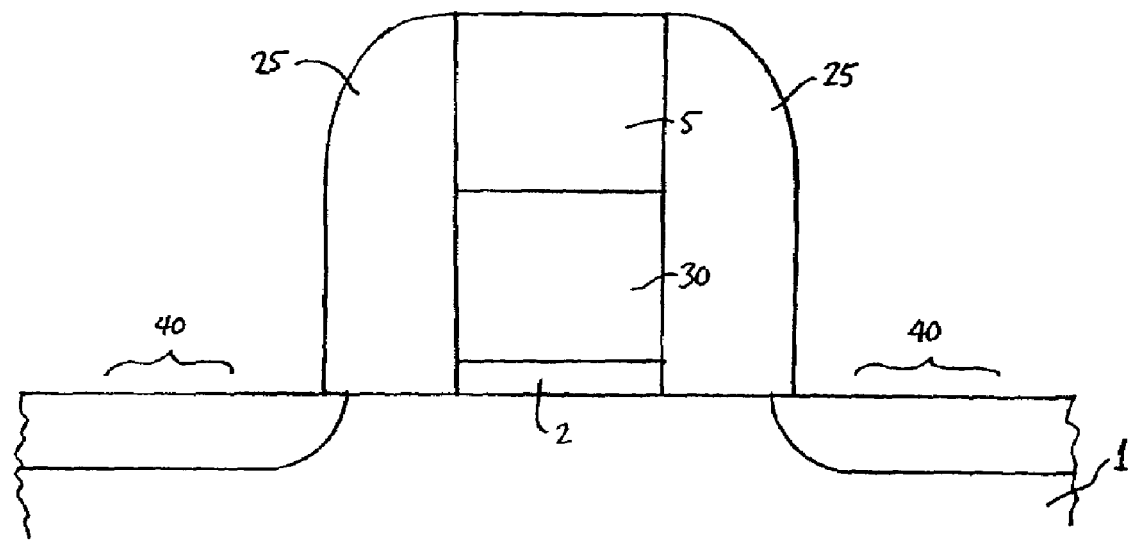
FIG. 4A illustrates a gate structure according to an embodiment of the invention, after formation of a metal silicide in contact with the gate dielectric.

The substrate is then patterned using photoresist 10, and layers 3–5 are etched to define the gate structure. The result of these etching processes is shown in FIG. 3. Further process steps are then performed, using techniques known in the art, to produce a gate structure including spacers 25 and source and drain regions 40. A typical process used at this point is a high-temperature activation anneal for the source and drain. During this annealing step, the metal layer 4 reacts with the underlying layer 3 of silicon material to produce a silicide layer 30 (e.g. $WSi_x$, $TiSi_x$, $PtSi_x$, $TaSi_x$, $NbSi_x$, $HfSi_x$, $MoSi_x$). As noted above, in this embodiment the thicknesses of silicon layer 3 and metal layer 4 are chosen so that the silicon material in layer 3 is fully silicided (that is, silicon layer 3 is replaced by a silicide layer). Accordingly, silicide 30 is in contact with gate dielectric 2, with unreacted silicon material from layer 5 over the silicide, as shown in FIG. 4A.

Figure 4B:
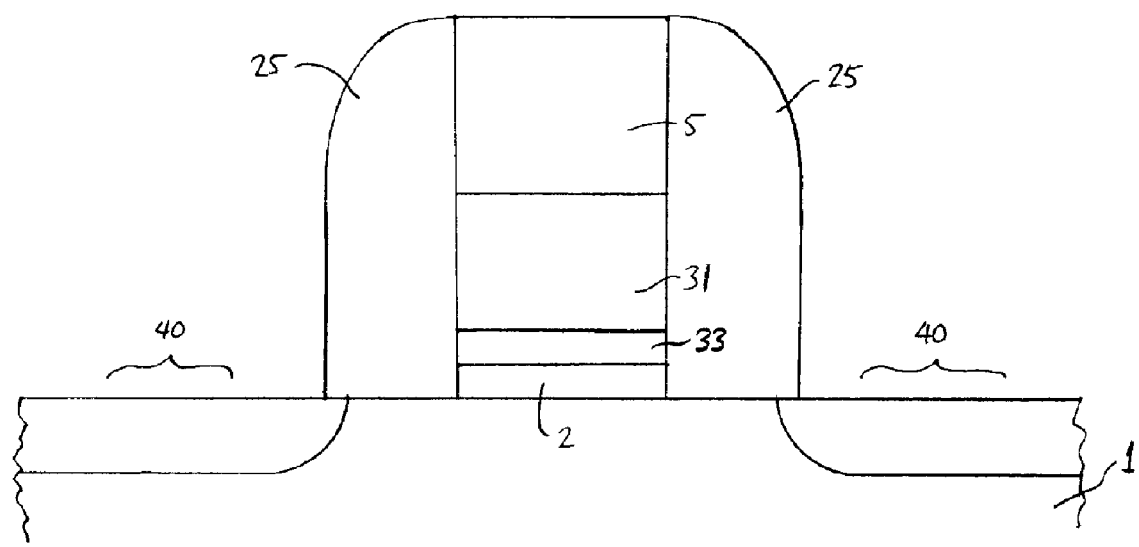
FIG. 4B illustrates a gate structure according to an alternate embodiment of the invention, after formation of a metal silicide in the first of two high-temperature processes.

Alternatively, if more than one high-temperature process is used, it is possible for the first high-temperature process (e.g. the activation anneal) not to cause all of the silicon material in layer 3 to react with the metal in layer 4 (so that layer 3 is incompletely silicided). In particular, this may be the case when the first high-temperature process has a limited thermal budget. In this case, as shown in FIG. 4B, a remaining layer 33 of silicon material overlies the gate dielectric after the first high-temperature process, while the silicide layer 31 is a metal-rich phase of silicide. In the second high-temperature process (details of which are discussed below), the silicon material in layer 33 is reacted to form a silicide material (the same material as in layer 30), so that layer 3 of silicon material is fully silicided after the second high-temperature process.

Figure 5:
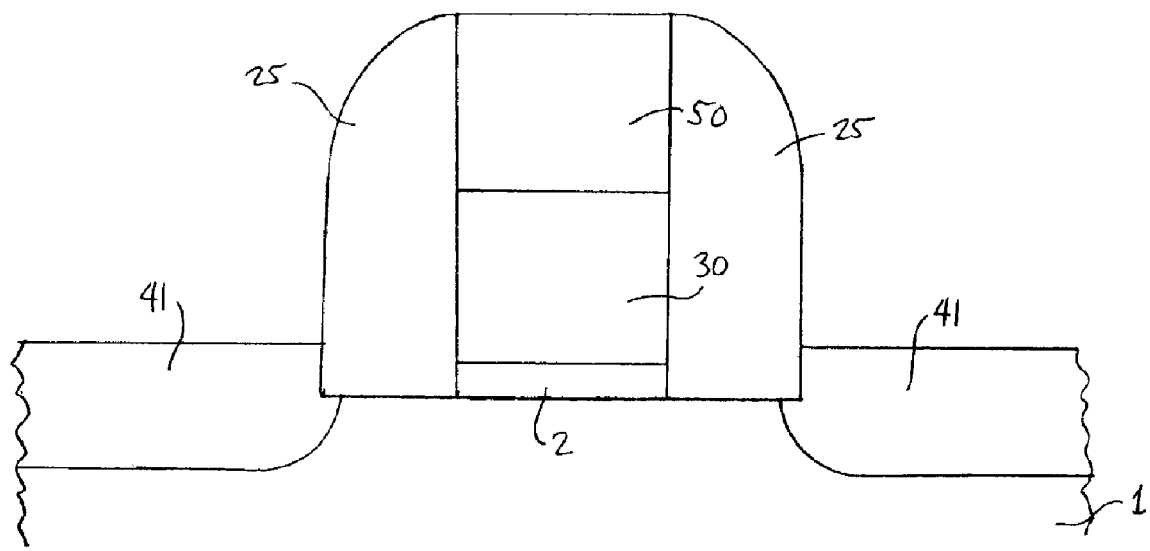
FIG. 5 illustrates a completed gate structure along with source and drain regions, according to an embodiment of the invention.

A metal (e.g. Ni, Co, Ti, Pt, etc.) is then deposited over the FET structure so that the metal is in contact with the silicon material in layer 5 as well as source/drain regions 40. A further silicide-formation process (known in the art) is then performed to form conducting silicide regions 41 in the source and drain. This same process causes the silicon at the top of the gate to react with the metal to form a silicide region 50 in the upper portion of the gate (and also convert to a silicide the remaining silicon material in layer 33, if any). The resulting structure is shown in FIG. 5. Thus the silicide material in source/drain regions 41 and region 50 of the gate are the same; the silicide 30 in the lower portion of the gate may be either the same material as in region 50 or a different material. (There may also be a transition layer, with a mixture of silicide materials, between the lower silicide layer 30 and the upper silicide layer 50.) The originally-deposited silicon in the gate structure is therefore replaced by silicide material; that is, the gate structure is said to be fully silicided. It will be appreciated that, in comparison with the conventional CMOS fabrication process, a fully silicided gate is produced with only one additional deposition process step, but without the need for CMP or etching processes for the polysilicon layers. Furthermore, the silicidation of gate material occurs as a result of subsequent high-temperature processes; no separate processes are required to form the silicide layers in the gate.

Figure 6:
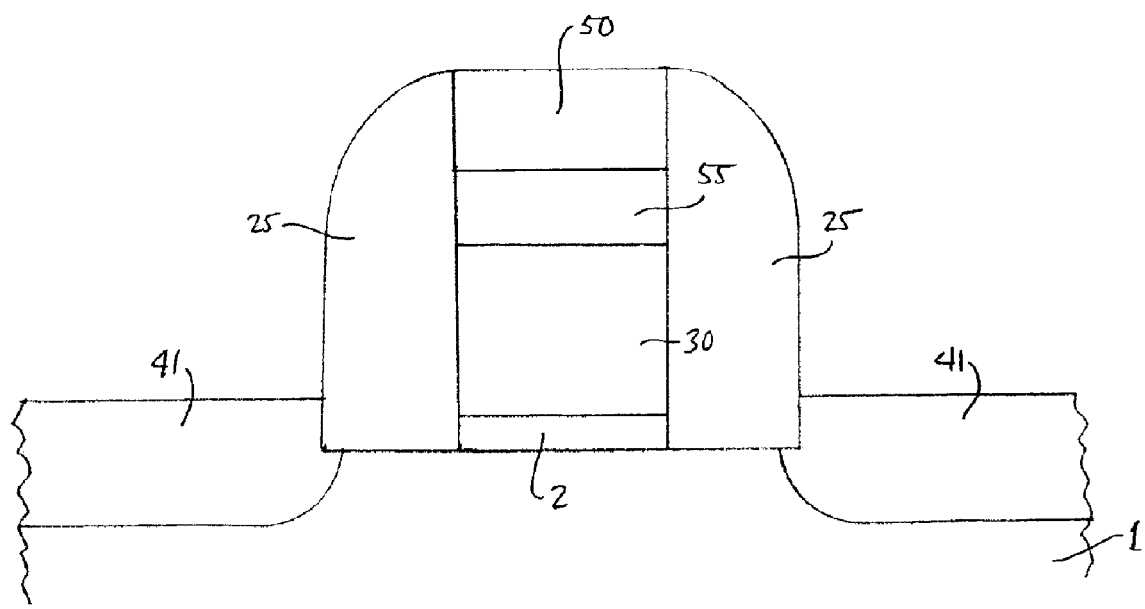
FIG. 6 illustrates a completed gate structure along with source and drain regions, according to an alternate embodiment of the invention.

In an alternate embodiment of the invention, the thickness of silicon layer 5 is chosen so that the silicon material overlying silicide 30 is not completely converted to a silicide during the source/drain silicidation process. Accordingly, there will be three gate materials over the gate dielectric; silicide 30, silicon 55 and silicide 50 (which is the same silicide material as in the source/drain regions 41). This structure is shown in FIG. 6.

As described above, the gate fabrication process of the present invention is simpler than the conventional process, and permits automatic formation of self-aligned silicide gate conductors.

While the present invention has been described in conjunction with specific preferred embodiments, it would be apparent to those skilled in the art that many alternatives, modifications and variations can be made without departing from the scope and spirit of the invention. Accordingly, the invention is intended to encompass all such alternatives, modifications and variations which fall within the scope and spirit of the invention and the following claims.

What is claimed is:

1. A method for forming a silicided gate structure in an FET device fabrication process, the gate structure having a gate dielectric on a substrate, the fabrication process including at least one high-temperature process, the method comprising the steps of:

forming a first layer of silicon material overlying the gate dielectric;

forming a layer of metal on the first layer;

forming a second layer of silicon material on the metal layer, and performing the high-temperature process subsequent to said forming steps, wherein the high-temperature process is effective to form a first silicide layer in contact with the gate dielectric by reaction of the metal with the silicon material in the first layer, the silicon material in the first layer thereby being replaced by silicide material in the first silicide layer, wherein the first layer, the layer of metal and the second layer are formed with thicknesses so that as a result of the high-temperature process, substantially all of the first layer and at least a portion of the second layer are reacted with the metal to form the silicide material.

2. A method according to claim 1, wherein the high-temperature process is performed at a temperature greater than about 700° C.

3. A method according to claim 1, wherein the high-temperature process is an annealing process for source and drain portions of the FET device.

4. A method according to claim 1, wherein the silicon material in the first layer is one of polysilicon and amorphous silicon, and the silicon material in the second layer is one of polysilicon and amorphous silicon.

5. A method according to claim 1, wherein the metal is selected from the group consisting of W, Ti, Pt, Ta, Nb, Hf and Mo.

6. A method according to claim 1, wherein the high-temperature process includes a first high-temperature process and a second high-temperature process, the second high-temperature process being performed subsequent to the first high-temperature processing step, and the second high-temperature process is effective to form a second suicide layer from the silicon material in the second layer, the second suicide layer overlying the first silicide layer and in contact therewith.

7. A method according to claim 6, wherein the second high-temperature process is a silicidation process for source and drain portions of the FET device, so that a silicide formed in said source and drain portions is the same material as in the second silicide layer.

8. A method according to claim 6, wherein the first high-temperature process and the second high-temperature process cause replacement of substantially all of the silicon material in the first layer and in the second layer by silicide material.

9. A method according to claim 1, wherein the high-temperature process includes a first high-temperature process and a second high-temperature process, the second high-temperature process being performed subsequent to the first high-temperature processing step, and the second high-temperature process is effective to form a second silicide layer from the silicon material in the second layer, the second suicide layer overlying a remaining portion of the second layer.

10. A method according to claim 9, wherein the second high-temperature process is a silicidation process for source and drain portions of the FET device, so that a suicide formed in said source and drain portions is the same material as in the second suicide layer.

11. A method according to claim 9, wherein the second high-temperature process is performed at a temperature greater than about 700° C.

12. A method for forming a silicided gate structure in an FET device fabrication process, the gate structure having a gate dielectric on a substrate, the method comprising the steps of:

forming a first layer of silicon material overlying the gate dielectric;

forming a layer of metal on the first layer;

forming a second layer of silicon material on the metal layer;

performing a first high-temperature process to form a first silicide layer above the gate dielectric by reaction of the metal with the silicon material in the first layer; and performing a second high-temperature process step to form a second silicide layer above the first silicide layer, wherein substantially all of the first layer of silicon material and the second layer of silicon material are reacted as a result of the first and second high-temperature processes to form a silicided gate.

13. A method according to claim 12, wherein the first high-temperature process and the second high-temperature process step are performed at a temperature greater than about 700° C.

14. A method according to claim 12, wherein the first high-temperature process is an annealing process for source and drain portions of the FET device.

15. A method according to claim 12, wherein the second high-temperature process is a silicidation process for source and drain portions of the FET device.

16. A method according to claim 12, wherein the metal is selected from the group consisting of W, Ti, Pt, Ta, Nb, Hf and Mo.

17. A method according to claim 12, wherein the silicon material in the first layer is one of polysilicon and amorphous silicon, and the silicon material in the second layer is one of polysilicon and amorphous silicon.

18. A method according to claim 12, wherein as a result of the first high-temperature process the first suicide layer overlies a remaining layer of silicon material, the remaining layer being in contact with the gate dielectric, and as a result of the second high-temperature process the silicon material is reacted to form a silicide layer in contact with the gate dielectric.

19. A gate structure for an FET device, comprising:

a gate dielectric on a substrate;

a first layer of a first silicide overlying the gate dielectric and in contact therewith; and a second layer of a second silicide overlying the first silicide layer, wherein said second layer is of the same material as silicide in source and drain regions of the FET, and the first silicide is a metal silicide, said metal being selected from the group consisting of W, Ti, Pt, Ta, Nb, Hf and Mo, and wherein the first layer, the layer of metal and the second layer are formed with thicknesses so that as a result of the high-temperature process, substantially all of the first layer and at least a portion of the second layer are reacted with the metal to form the silicide material.

* * * * *